US012793935B2

(12) United States Patent
Kim et al.

(10) Patent No.: US 12,793,935 B2
(45) Date of Patent: Nov. 10, 2026

(54) ION BEAM REFLECTOR, SUBSTRATE PROCESSING APPARATUS INCLUDING THE SAME, AND SUBSTRATE PROCESSING METHOD USING THE SAME

(71) Applicant: Samsung Electronics Co., Ltd., Suwon-si (KR)

(72) Inventors: Hoonseop Kim, Suwon-si (KR); Sang Ki Nam, Suwon-si (KR); Sungho Jang, Suwon-si (KR); Kyunghyun Kim, Suwon-si (KR); Changwook Lee, Suwon-si (KR); Sungwon Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 286 days.

(21) Appl. No.: 18/775,214

(22) Filed: Jul. 17, 2024

(65) Prior Publication Data

US 2025/0232948 A1 Jul. 17, 2025

(30) Foreign Application Priority Data

Jan. 11, 2024 (KR) ........................ 10-2024-0004612

(51) Int. Cl.
*H01J 37/30* (2006.01)
*H01J 37/244* (2006.01)
*H01J 37/305* (2006.01)

(52) U.S. Cl.
CPC ........ *H01J 37/3007* (2013.01); *H01J 37/244* (2013.01); *H01J 37/3056* (2013.01); *H01J 2237/002* (2013.01); *H01J 2237/24585* (2013.01); *H01J 2237/303* (2013.01); *H01J 2237/3174* (2013.01)

(58) Field of Classification Search
CPC .. H01J 37/3007; H01J 37/244; H01J 37/3056; H01J 37/3053; H01J 37/026;
(Continued)

(56) References Cited

U.S. PATENT DOCUMENTS 6,926,799 B2 8/2005 Yeom et al.
7,282,702 B2 10/2007 Jeon et al.
(Continued)

FOREIGN PATENT DOCUMENTS

CN 113556858 A 10/2021
JP 3546370 B2 7/2004
(Continued)

OTHER PUBLICATIONS

D. H. Lee et al., "Characteristics of neutral beam generated by reflection on a planar-type reflector and its etching properties," Surface and Coatings Technology, vols. 177-178, Jan. 30, 2004, pp. 420-425.

(Continued)

*Primary Examiner* — Rodney G Mcdonald
(74) *Attorney, Agent, or Firm* — Fish & Richardson P.C.

(57) ABSTRACT

A substrate processing apparatus may comprise an ion beam reflector, and the ion beam reflector may comprise a support ring including a neutralization space, the neutralization space extending in a first direction, a plurality of reflection plates coupled to the support ring, the plurality of reflection plates extending in a second direction across the neutralization space, the second direction intersecting the first direction, the plurality of reflection plates being spaced apart from each other in a third direction which intersects the first direction and the second direction, and each of the plurality of reflection plates including a cooling passage that extends in the second direction.

20 Claims, 12 Drawing Sheets

(58) Field of Classification Search
CPC ................. H01J 37/32522; H01J 37/05; H01J 37/32422; H01J 37/3211; H01J 2237/002; H01J 2237/24585; H01J 2237/303; H01J 2237/3174; H01J 2237/0041
USPC ........ 204/298.36, 192.34; 156/345.39, 345.4
See application file for complete search history.

(56) References Cited

U.S. PATENT DOCUMENTS

| | | | |
|---|---|---|---|
| 7,446,325 | B2 | 11/2008 | Hwang et al. |
| 10,790,119 | B2 | 9/2020 | Ma et al. |
| 2006/0219887 | A1 | 10/2006 | Hwang et al. |

FOREIGN PATENT DOCUMENTS

| | | | |
|---|---|---|---|
| JP | 2014-044098 | A | 3/2014 |
| KR | 10-0676396 | B1 | 2/2007 |
| KR | 10-0714895 | B1 | 5/2007 |
| KR | 10-0722821 | B1 | 5/2007 |
| KR | 10-1140502 | B1 | 4/2012 |

OTHER PUBLICATIONS

T.N. Rhodin, Jr et al., "Low Temperature Oxidation of Copper. I. Physical Mechanism," Journal of the Americal Chemical Society, Nov. 1, 1950, vol. 72, p. 5102-5106.

M. Fouaidy et al., "RRR of copper coating and low temperature electrical resistivity of material for TTF couplers," Physica C: Superconductivity vol. 441, Issues 1-2, Jul. 15, 2006, pp. 137-144.

ION BEAM REFLECTOR, SUBSTRATE PROCESSING APPARATUS INCLUDING THE SAME, AND SUBSTRATE PROCESSING METHOD USING THE SAME

CROSS-REFERENCE TO RELATED APPLICATION

This U.S. nonprovisional application claims the benefit of priority under 35 U.S.C § 119 to Korean Patent Application No. 10-2024-0004612 filed on Jan. 11, 2024 in the Korean Intellectual Property Office, the disclosure of which is hereby incorporated by reference in its entirety.

BACKGROUND

Various example embodiments of the present inventive concepts relate to an ion beam reflector, a substrate processing apparatus including the same, and/or a substrate processing method using the same. More particularly, one or more example embodiments are directed to an ion beam reflector whose damage is reduced and/or prevented by cooling the ion beam reflector, a substrate processing apparatus including the same, and/or a substrate processing method using the same.

A semiconductor device may be fabricated using various processes. For example, the semiconductor device may be manufactured through a photolithography process, an etching process, a deposition process, and/or a plating process on a semiconductor substrate. An ion beam extracted from plasma may be used in an etching process performed on a substrate. For example, an ion beam etching apparatus may be used to etch a substrate with an ion beam extracted from plasma using a grid. As another example, a neutral beam etching apparatus may be used to etch a substrate with a neutral beam extracted from plasma using a grid.

SUMMARY

Some example embodiments of the present inventive concepts provide an ion beam reflector capable of reduced heating and/or capable of being prevented from overheating, a substrate processing apparatus including the same, and/or a substrate processing method using the same.

Some example embodiments of the present inventive concepts provide an ion beam reflector capable of reducing and/or preventing damage of a temperature sensor that measures a temperature of the ion beam reflector, a substrate processing apparatus including the same, and/or a substrate processing method using the same.

Some example embodiments of the present inventive concepts provide an ion beam reflector capable of uniformly etching a substrate, a substrate processing apparatus including the same, and/or a substrate processing method using the same.

Some example embodiments of the present inventive concepts provide an ion beam reflector capable of being used for a long time, a substrate processing apparatus including the same, and/or a substrate processing method using the same.

The objects of the present inventive concepts are not limited to the mentioned above, and other objects which have not been mentioned above will be clearly understood to those of ordinary skill in the art from the following description.

According to some example embodiments of the present inventive concepts, a substrate processing apparatus may comprise an ion beam reflector, and the ion beam reflector may comprise: a support ring including a neutralization space, the neutralization space extending in a first direction, and a plurality of reflection plates coupled to the support ring, the plurality of reflection plates extending in a second direction across the neutralization space, the second direction intersecting the first direction, the plurality of reflection plates being spaced apart from each other in a third direction which intersects the first direction and the second direction, and each of the plurality of reflection plates including a cooling passage that extends in the second direction.

According to some example embodiments of the present inventive concepts, a substrate processing apparatus may comprise: a first grid including a first through hole, the first through hole extending in a first direction, a second grid on the first grid, the second grid including a second through hole, the second through hole extending in the first direction, and an ion beam reflector beneath the first grid, the ion beam reflector including, a support ring, the support ring defining a neutralization space, the neutralization space extending in the first direction, a reflection plate that extends in a second direction, the second direction intersecting the first direction, the reflection plate extending along the support ring, the reflection plate inclined with respect to the first direction, the reflection plate including a first lateral surface that faces toward the first grid and a second lateral surface opposite to the first lateral surface, and a temperature sensor connected to the second lateral surface.

According to some example embodiments of the present inventive concepts, a substrate processing method may comprise: etching a substrate using an ion beam and an ion beam reflector, the etching the substrate including, applying a radio-frequency (RF) power waveform to at least one RF coil to generate a plasma from a process gas, applying a first voltage to a grid beneath the RF coil to generate the ion beam from the plasma, the grid above the ion beam reflector, supplying a cooling fluid to the ion beam reflector, and measuring a temperature of the ion beam reflector using a temperature sensor.

Details of other example embodiments are included in the description and drawings.

DETAILED DESCRIPTION

Figure 1:
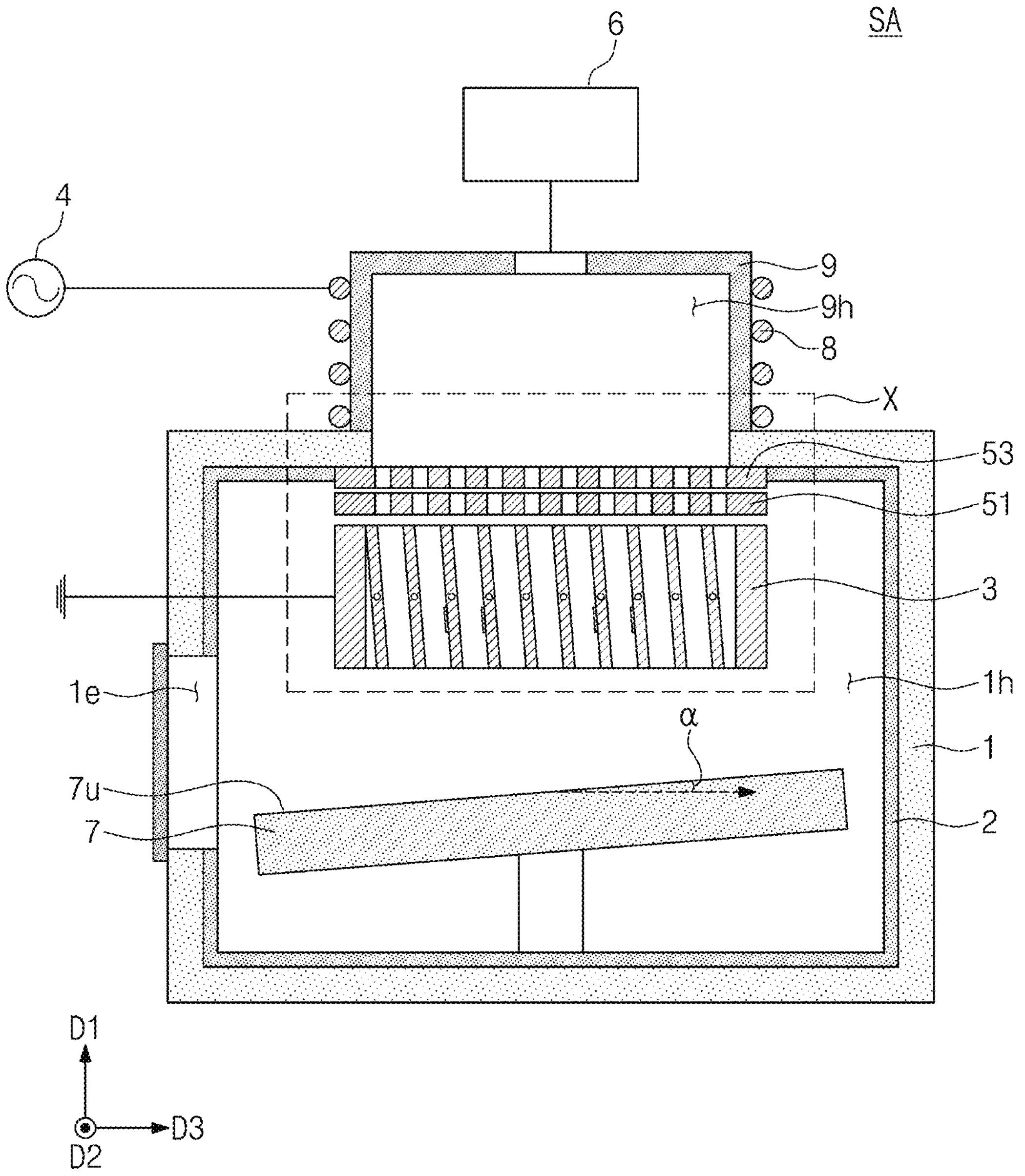
FIG. 1 illustrates a cross-sectional view showing a substrate processing apparatus according to some example embodiments of the present inventive concepts.

The following will now describe various example embodiments of the present inventive concepts with reference to the accompanying drawings. Like reference numerals may indicate like components throughout the description.

Figure 2:
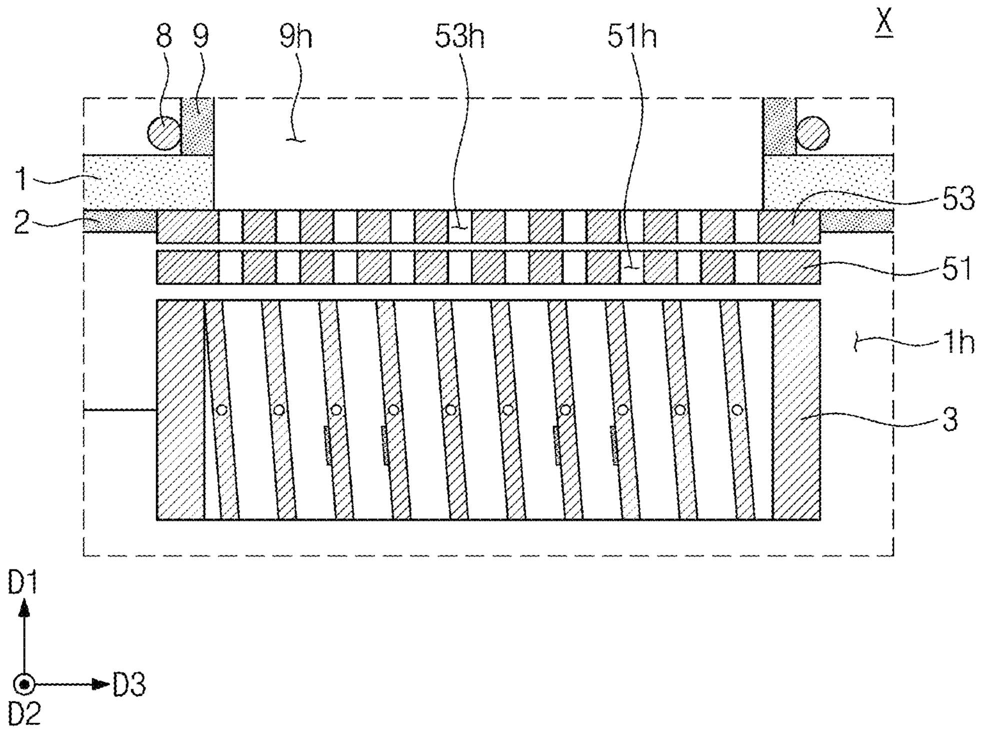
FIG. 2 illustrates an enlarged cross-sectional view showing section X of FIG. 1 according to at least one example embodiment.

FIG. 1 illustrates a cross-sectional view showing a substrate processing apparatus according to some example embodiments of the present inventive concepts. FIG. 2 illustrates an enlarged cross-sectional view showing section X of FIG. 1 according to at least one example embodiment.

In this description, symbol D1 may indicate a first direction, symbol D2 may indicate a second direction that intersects the first direction D1, and symbol D3 may indicate a third direction that intersects each of the first direction D1 and the second direction D2. The first direction D1 may be called an upward direction or a vertical direction. Each of the second direction D2 and the third direction D3 may be called a horizontal direction.

Referring to FIGS. 1 and 2, a substrate processing apparatus SA may be provided. The substrate processing apparatus SA may be a device for performing an etching process on a substrate. For example, the substrate processing apparatus SA may be a device in which a neutral beam is used to etch a substrate. The term "substrate" used in this description may mean a silicon (Si) wafer and/or other semiconductor wafer, but the example embodiments of the present inventive concepts are not limited thereto. The substrate processing apparatus SA may etch a substrate by using a neutral beam obtained by neutralizing an ion beam. The substrate processing apparatus SA may include a process chamber 1, a plasma chamber 9, a gas supply 6, a radio-frequency (RF) coil 8, a radio-frequency (RF) power source 4, a stage 7, an insulation wall 2, a grid, and/or an ion beam reflector 3, etc., but is not limited thereto, and for example, may include a greater or lesser number of constituent components.

The process chamber 1 may provide a process space 1*h* (e.g., a process chamber, etc.). The process space 1*h* may have a cylindrical shape, but the example embodiments of the present inventive concepts are not limited thereto. The process space 1*h* may be connected through an inlet 1*e* to an external space and/or external region, etc. A substrate etching process may be performed in the process space 1*h*.

The plasma chamber 9 may be positioned on the process chamber 1, but is not limited thereto. The plasma chamber 9 may provide a plasma space 9*h*. A plasma may be generated in the plasma space 9*h*. The plasma space 9*h* may be connected to the process space 1*h*. For example, the plasma space 9*h* and the process space 1*h* may be connected through the grid and the ion beam reflector 3. A portion of plasma in the plasma space 9*h* may be irradiated in the form of an ion beam and/or a neutral beam to a substrate positioned in the process space 1*h*. A detailed description thereof will be further discussed below.

The gas supply 6 may be connected to the plasma chamber 9. The gas supply 6 may supply the plasma space 9*h* with a process gas for generating a plasma. According to at least one example embodiment, the process gas may be argon (Ar), but is not limited thereto. The gas supply 6 may include a gas tank, a gas pipe, a compressor, and so forth. At least a portion of the process gas supplied from the gas supply 6 may be converted into plasma in the plasma space 9*h*.

The RF coil 8 may surround the plasma chamber 9. When a RF power is applied to the RF coil 8, one or both of an electric field and/or a magnetic field may be produced in the plasma space 9*h*. Therefore, at least a portion of gas may be converted into plasma in the plasma space 9*h* using the electric field and/or magnetic field. For example, according to at least one example embodiment of the present inventive concepts, the substrate processing apparatus SA may use an induced coupled plasma (ICP) process to generate plasma, but the example embodiments are not limited thereto.

The RF power source 4 may be connected to the RF coil 8. The RF power source 4 may apply (e.g., supply, transmit, transfer, etc.) RF power to the RF coil 8. In other words, the RF power source may be a power source, power generator, etc., which supplies power with a frequency in the RF frequency range to the RF coil 8 to generate the electric field and/or magnetic field (e.g., an electromagnetic field, etc.).

The stage 7 may be positioned in the process chamber 1. For example, the stage 7 may be positioned in the process space 1*h*, etc. The stage 7 may support a substrate. A top surface 7*u* of the stage 7 may make an acute angle $\alpha$ with the horizontal direction, but is not limited thereto. The acute angle $\alpha$ formed between the top surface 7*u* of the stage 7 and the horizontal direction may range from about 1° to approximately 30°. For example, the acute angle $\alpha$ formed between the top surface 7*u* of the stage 7 and the horizontal direction may range from about 1° to approximately 9°, but the example embodiments of the present inventive concepts are not limited thereto.

The insulation wall 2 may be combined with an inner surface of the process chamber 1, but is not limited thereto, and for example, the insulation wall 2 may be separate from the inner surface of the process chamber 1. The insulation wall 2 may include a material having a low heat transfer coefficient, e.g., a heat transfer coefficient below a desired threshold. Accordingly, the heat exchange between the process space 1*h* and an external space may be low and/or below a desired heat transfer threshold. The desired heat transfer threshold may be selected based on semiconductor device manufacturing considerations, construction considerations, and/or safety considerations, etc.

The grid may be positioned below the plasma space 9*h* in the vertical direction, but is not limited thereto. For example, the grid may be placed beneath one or both of the plasma chamber 9 and the RF coil 8. The grid may have, for example, a circular plate shape, but is not limited thereto. The grid may be provided in plural. For example, a first grid 51 and a second grid 53 may be provided, etc.

The first grid 51 may include at least a first through hole 51*h*. The first through hole 51*h* may penetrate through the first grid 51 in the first direction D1, but is not limited thereto. The first through hole 51*h* may have a circular shape when viewed in plan, but the example embodiments of the present inventive concepts are not limited thereto, and for example, the first through hole 51*h* may have other shapes. The first through hole 51*h* may be provided in plural. For example, a plurality of first through holes 51*h* may be spaced apart from each other in the first grid 51 in the horizontal direction, etc. A single first through hole 51*h* will be discussed in the interest of clarity and brevity.

The second grid 53 may be positioned on and/or above the first grid 51, but is not limited thereto. The second grid 53 may include at least one second through hole 53*h*. The second through hole 53*h* may penetrate through the second grid 53 in the first direction D1. The second through hole 53*h* may have a circular shape when viewed in plan, but the example embodiments of the present inventive concepts are not limited thereto, and for example, the second through hole 53*h* may have other shapes. The second through hole 53*h* may be provided in plural. A plurality of second through holes 53*h* may be spaced apart from each other in the horizontal direction, etc. A single second through hole 53*h* will be discussed in the interest of clarity and brevity.

The plasma space 9*h* and the process space 1*h* may be connected through the first through hole 51*h* and the second through hole 53*h*. Each of the first grid 51 and the second grid 53 may be formed using a metal material and/or metal alloy, etc., but the example embodiments of the present inventive concepts are not limited thereto. While it is illustrated and described that two grids are provided, but the example embodiments of the present inventive concepts are not limited thereto. For example, only a single grid may be provided according to some example embodiments. As another example, three or more grids may be provided.

The ion beam reflector 3 may be positioned between the first grid 51 and the stage 7. The ion beam reflector 3 will be further discussed in detail below.

Figure 3:
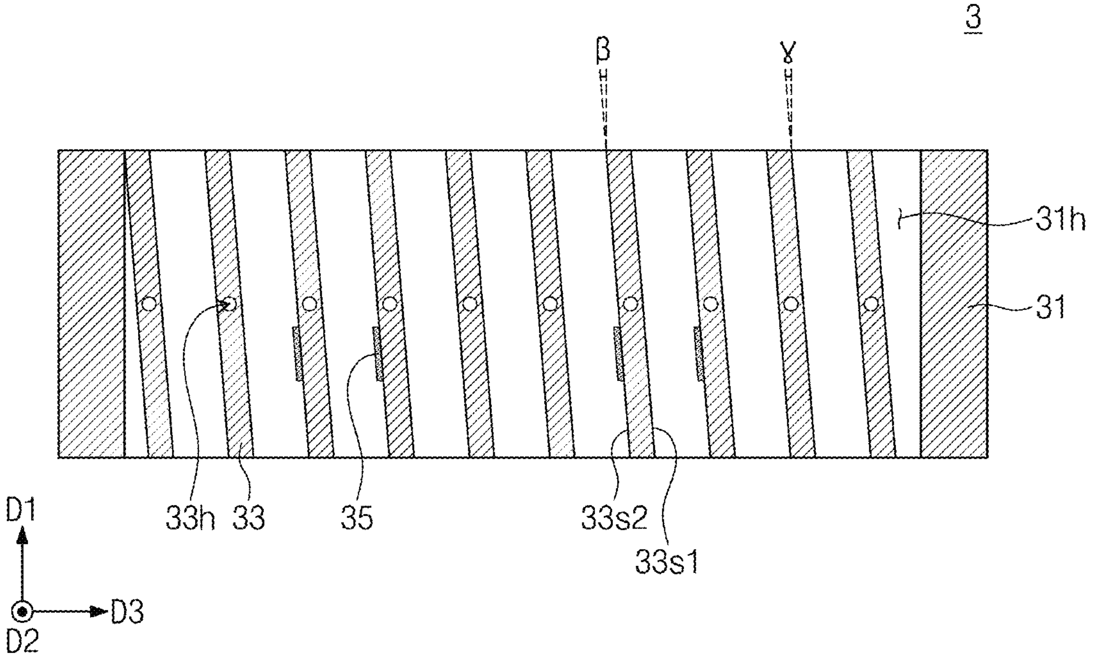
FIG. 3 illustrates a cross-sectional view showing an ion beam reflector according to some example embodiments of the present inventive concepts.
Figure 4:
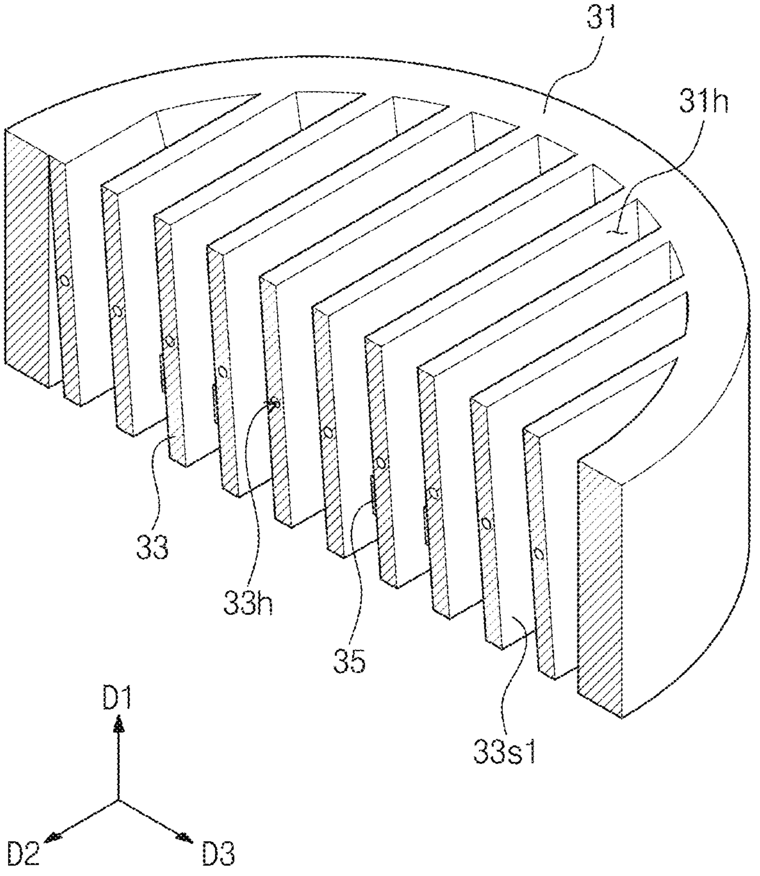
FIG. 4 illustrates a cut perspective view showing an ion beam reflector according to some example embodiments of the present inventive concepts.

FIG. 3 illustrates a cross-sectional view showing an ion beam reflector according to some example embodiments of the present inventive concepts. FIG. 4 illustrates a cut perspective view showing an ion beam reflector according to some example embodiments of the present inventive concepts.

Referring to FIGS. 3 and 4, the ion beam reflector 3 may include at least one support ring 31, at least one reflection plate 33, and/or at least one temperature sensor 35, etc., but is not limited thereto.

The support ring 31 may provide and/or include a neutralization space 31*h*, or in other words, the support ring 31 may define the neutralization space 31*h*. The neutralization space 31*h* may vertically penetrate the support ring 31, or in other words, the neutralization space 31*h* may refer to an interior space and/or region of the support ring 31. For example, the neutralization space 31*h* may penetrate through the support ring 31 in the first direction D1, but is not limited thereto. In this sense, the neutralization space 31*h* may be a space defined by an inner surface (e.g., an inner vertical surface) of the support ring 31. A thickness in the first direction D1 of the support ring 31 may be greater than a thickness in the first direction D1 of each of the first grid 51 and the second grid 53, but is not limited thereto. For example, the thickness in the first direction D1 of the support ring 31 may range from about 1 cm to approximately 30 cm, but the example embodiments of the present inventive concepts are not limited thereto. As shown in FIG. 1, the support ring 31 may be electrically grounded, but is not limited thereto. The support ring 31 may be formed from a conductive material, but is not limited thereto. For example, the support ring 31 may include metal and/or a metal alloy, but the example embodiments of the present inventive concepts are not limited thereto and other materials may be used.

The reflection plate 33 may be combined and/or included with the support ring 31. The reflection plate 33 may run and/or extend across the neutralization space 31*h*. For example, the reflection plate 33 may extend in the second direction D2 to run and/or extend in the second direction D2 across the neutralization space 31*h*. A thickness in the first direction D1 of the reflection plate 33 may be the same and/or substantially the same (e.g., +/−10%) as the thickness in the first direction D1 of the support ring 31, but the example embodiments are not limited thereto. One end (e.g., a first end) of the reflection plate 33 may be combined with one side (e.g., a first side) of the support ring 31. Another end (e.g., a second end) of the reflection plate 33 may be combined with another side (e.g., a second side) of the support ring 31.

The reflection plate 33 may make an acute angle with respect to an imaginary axis extending along the first direction D1. For example, a first lateral surface 33*s*1 of the reflection plate 33 may form a first acute angle γ with an imaginary axis extending along the first direction D1. The first acute angle γ may range from approximately 1° to approximately 9°, but the example embodiments of the present inventive concepts are not limited thereto. A second lateral surface 33*s*2 of the reflection plate 33 may make a second acute angle β with the imaginary axis extending along the first direction D1. The second acute angle β may range from approximately 1° to approximately 9°, but the example embodiments of the present inventive concepts are not limited thereto. As the reflection plate 33 is in an incline position, the first lateral surface 33*s*1 of the reflection plate 33 may be directed toward the first grid 51. The second lateral surface 33*s*2 may stand opposite to the first lateral surface 33*s*1. The second lateral surface 33*s*2 may be directed toward the stage (see reference numeral 7 of FIG. 1).

The reflection plate 33 may be formed from a conductive material, but is not limited thereto. For example, the reflection plate 33 may include metal and/or a metal alloy, but the example embodiments of the present inventive concepts are not limited thereto and the reflection plate 33 may be formed from other materials. The reflection plate 33 and the support ring 31 may form a single unitary piece, but is not limited thereto. The example embodiments of the present inventive concepts, however, are not limited thereto, and the reflection plate 33 separately formed may be combined with the support ring 31, etc.

The reflection plate 33 may provide and/or include at least one cooling passage 33*h*. The cooling passage 33*h* may extend in the second direction D2. For example, the cooling passage 33*h* may extend in the second direction D2 in the reflection plate 33. The cooling passage 33*h* may penetrate through the reflection plate 33 in the second direction D2. Thus, one end (e.g., a first end) of the cooling passage 33*h* may be connected to one side (e.g., a first end) of the support ring 31. Another end (e.g., a second end) of the cooling passage 33*h* may be connected to another side (e.g., a second side) of the support ring 31. The cooling passage 33*h* will be further discussed in detail below.

The reflection plate 33 may be provided in plural. The plurality of reflection plates 33 may be spaced apart from each other in the third direction D3. The plurality of reflection plates 33 may have irregular lengths in the second direction D2, but the example embodiments are not limited thereto, and for example, the plurality of reflection plates 33 may have the same length, etc. Unless otherwise especially stated, a single reflection plate 33 will be discussed.

The temperature sensor 35 may be combined and/or included with the reflection plate 33. The temperature sensor 35 may measure a temperature of the reflection plate 33. For example, the temperature sensor 35 may include one or more of a thermocouple, a resistance temperature device (RTD), a thermistor, an infrared thermometer, and/or a platinum resistance temperature sensor (PT-RTD), etc. The temperature sensor 35 may be combined and/or included with a lateral surface of the reflection plate 33, but is not limited thereto. For example, the temperature sensor 35 may be combined and/or included with the second lateral surface 33s2 of the reflection plate 33. A detailed description thereof will be further discussed below.

It is illustrated and described that the temperature sensor 35 is combined and/or included with an outer surface of the reflection plate 33, but the example embodiments of the present inventive concepts are not limited thereto. For example, the temperature sensor 35 may be positioned within the reflection plate 33, etc., and positioned such that the temperature sensor 35 may measure the temperature of the reflection plate 33, etc. In this case, the temperature sensor 35 may not be outwardly observed, etc.

Figure 5:
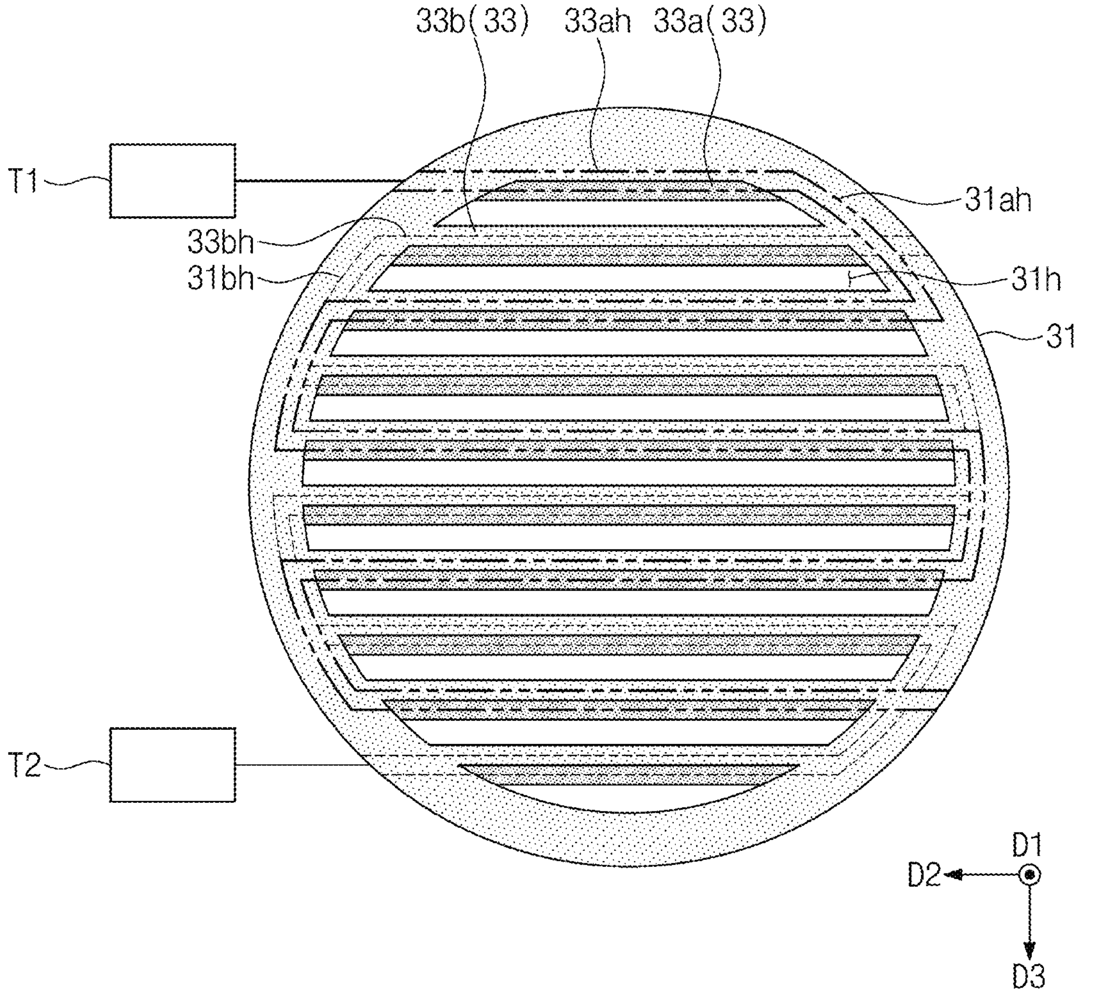
FIG. 5 illustrates a plan view showing an ion beam reflector according to some example embodiments of the present inventive concepts.

FIG. 5 illustrates a plan view showing an ion beam reflector according to some example embodiments of the present inventive concepts.

Referring to FIG. 5, a first reflection plate 33a and a second reflection plate 33b may be provided, but the example embodiments are not limited thereto, and for example, the ion beam reflector may include a greater or lesser number of reflection plates, etc.

The first reflection plate 33a may provide and/or include at least one first cooling passage 33ah, but is not limited thereto, and for example, may include a plurality of cooling passages, etc. The first cooling passage 33ah may penetrate the first reflection plate 33a in the second direction D2 to.

The second reflection plate 33b may provide and/or include at least one second cooling passage 33bh, but is not limited thereto, and for example, may include a plurality of cooling passages, etc. The second cooling passage 33bh may penetrate the second reflection plate 33b in the second direction D2. The second cooling passage 33bh may not be connected to the first cooling passage 33ah.

Each of the first and second reflection plates 33a and 33b may be provided in plural. The plurality of first reflection plates 33a may be arranged one-to-one alternately with the plurality of second reflection plates 33b, or in other words, individual first reflection plates of the plurality of first reflection plates 33a and individual second reflection plates of the plurality of second reflection plates 33b may alternate.

The support ring 31 may provide at least one first connection passage 31ah and at least one second connection passage 31bh, etc., but is not limited thereto.

The first connection passage 31ah may extend in a circumferential direction in (and/or inside) the support ring 31. The first connection passage 31ah may connect to each of two neighboring first cooling passages 33ah, but is not limited thereto. In other words, the first connection passage 31ah may connect to a pair of neighboring first cooling passages 33ah, etc.

The second connection passage 31bh may extend in a circumferential direction in (and/or inside) the support ring 31. The second connection passage 31bh may connect to each of the two neighboring second cooling passages 33bh, but is not limited thereto. In other words, the second connection passage 31bh may connect to a pair of neighboring second cooling passages 33bh, etc. The second connection passage 31bh may not be connected to the first connection passage 31ah.

The substrate processing apparatus (e.g., substrate processing apparatus SA of FIG. 1) may further include a first cooling fluid supply T1 and/or a second cooling fluid supply T2, etc.

The first cooling fluid supply T1 may supply the first cooling passage 33ah with a cooling fluid (e.g., coolant, etc.). The first cooling fluid supply T1 may be connected to one or both of the first cooling passage 33ah and the first connection passage 31ah. The first cooling fluid supply T1 may include a cooling fluid tank, a cooling pipe, a compressor, and so forth.

The second cooling fluid supply T2 may supply the second cooling passage 33bh with a cooling fluid (e.g., coolant, etc.). The second cooling fluid supply T2 may be connected to one or both of the first cooling passage 33ah and the second connection passage 31bh. The second cooling fluid supply T2 may include a cooling fluid tank, a cooling pipe, a compressor, and so forth.

A first connection position between the first cooling fluid supply T1 and the first cooling passage 33ah may be spaced apart from a second connection position between the second cooling fluid supply T2 and the second cooling passage 33bh. For example, the first connection position between the first cooling fluid supply T1 and the first cooling passage 33ah may be spaced apart in the third direction D3 from the second connection position between the second cooling fluid supply T2 and the second cooling passage 33bh.

While FIG. 5 is described as including a plurality of each of the first and second reflection plates 33a and 33b, the example embodiments are not limited thereto, and for example, the substrate processing apparatus may include a single first reflection plate 33a and/or a single second reflection plate 33b, as will be discussed below. In addition, the following will discuss a single cooling passage 33ah and a single second cooling passage 33bh, but the example embodiments are not limited thereto.

Referring to FIGS. 3 and 5, the temperature sensor 35 may be combined and/or included with the second lateral surface 33s2, such that the temperature sensor 35 may not be observed when viewed in plan. For example, as shown in FIG. 5, when the ion beam reflector 3 is viewed from above, the temperature sensor 35 may be coupled and/or attached to the second lateral surface 33s2 so as not to allow the temperature sensor 35 to be observed, but the example embodiments are not limited thereto. Therefore, even when the ion beam reflector 3 receives an ion beam released from the first through hole (see, e.g., first through hole 51h of FIG. 2) of the first grid (see, e.g., first gird 51 of FIG. 2), the ion beam may not collide with the temperature sensor 35. The temperature sensor 35 may thus be prevented from being damaged and/or the damage suffered by the temperature sensor 35 from the ion beam may be reduced and/or prevented.

Figure 6:
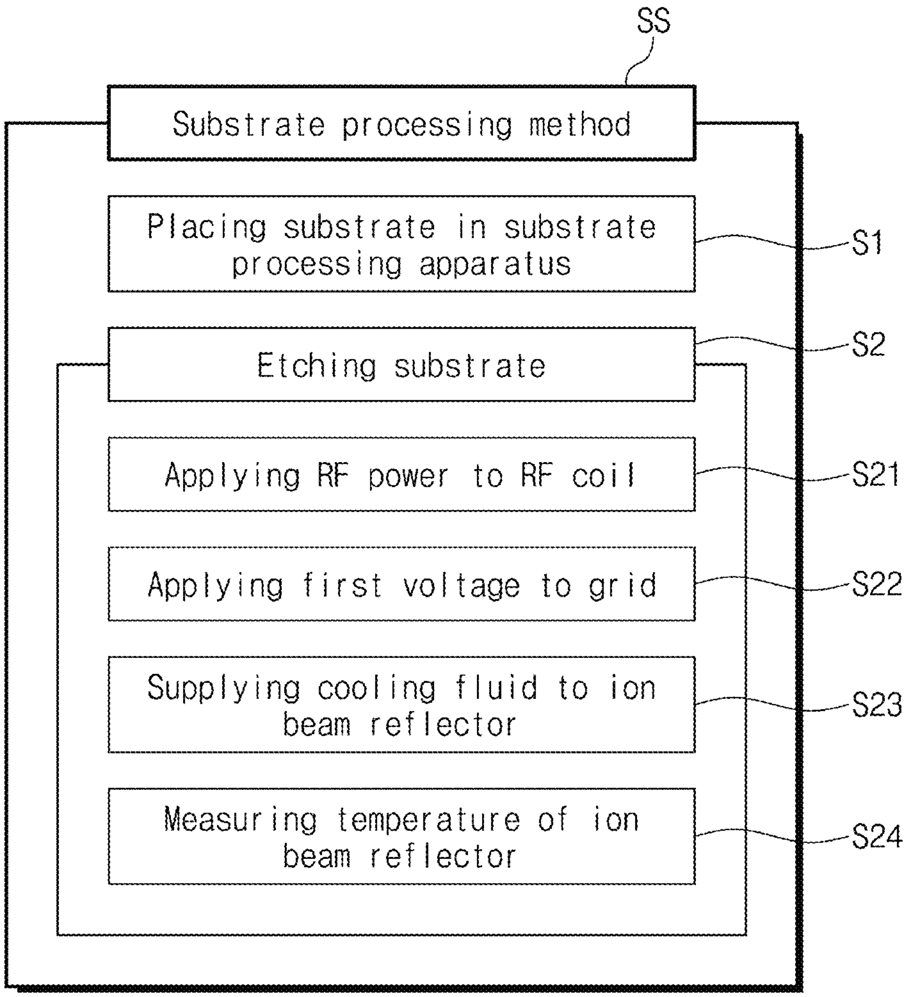
FIG. 6 illustrates a flow chart showing a substrate processing method according to some example embodiments of the present inventive concepts.

FIG. 6 illustrates a flow chart showing a substrate processing method according to some example embodiments of the present inventive concepts.

Referring to FIG. 6, a substrate processing method SS may be provided according to at least one example embodiment. The substrate processing method SS may be a way of processing a substrate by using the substrate processing apparatus SA discussed with reference to FIGS. 1 to 5, but is not limited thereto. The substrate processing method SS may include an operation S1 of placing a substrate in a substrate processing apparatus, and in operation S2, etching the substrate.

For example, operation S2 may further include operation S21 wherein the RF power source generates a RF power waveform and applies (and/or supplies) the generated RF power waveform to a RF coil. In operation S22, a resultant first voltage is applied to a grid, in operation S23, a cooling fluid is supplied to an ion beam reflector by at least one cooling fluid supply, and in operation S24, a temperature of the ion beam reflector is measured by a temperature sensor.

The substrate processing method SS according to the flow chart of FIG. 6 will be discussed in further detail below with references to FIGS. 7 to 11.

FIGS. 7 to 11 illustrate diagrams showing a substrate processing method according to the flow chart of FIG. 6 according to some example embodiments.

Figure 7:
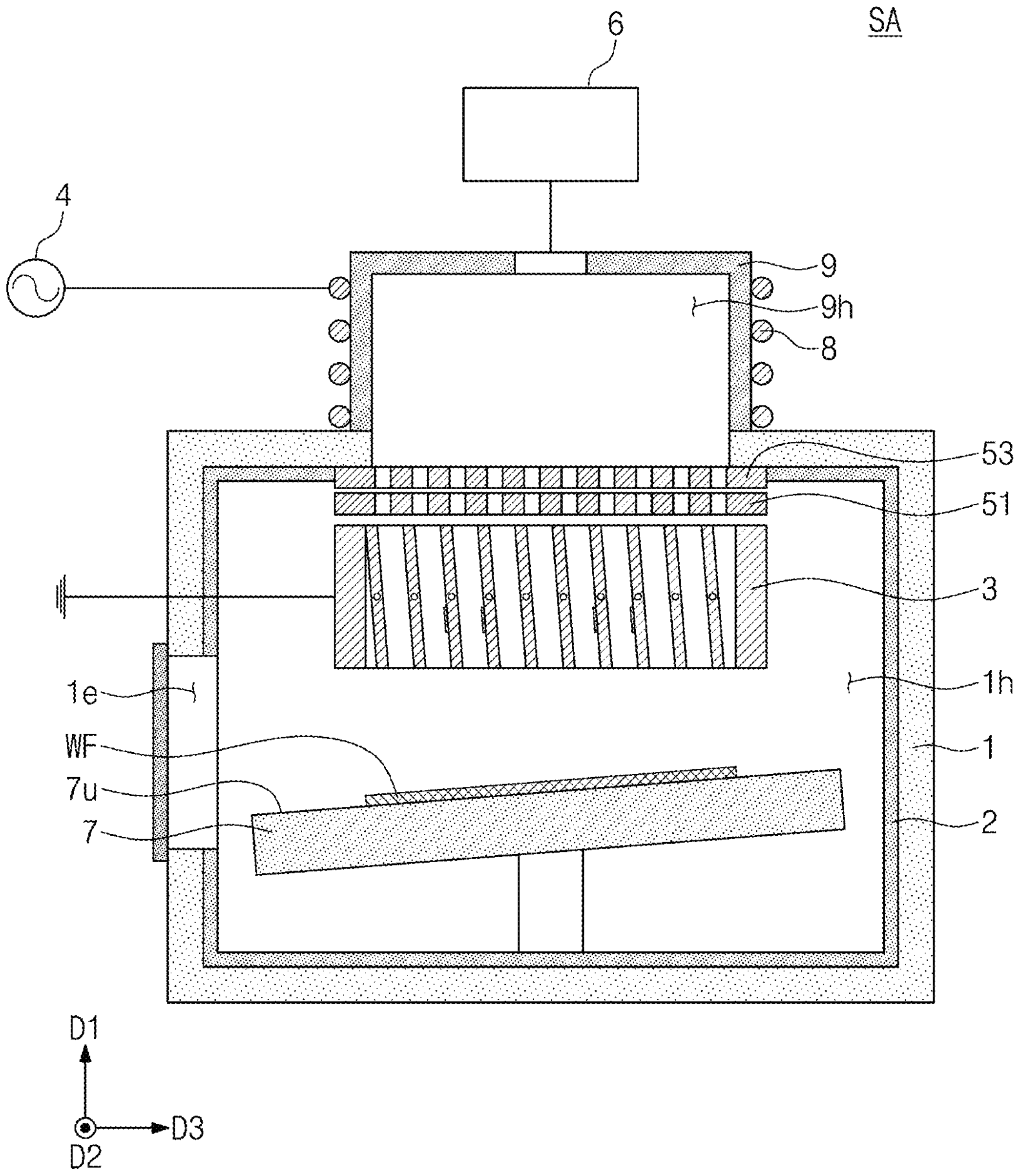
FIGS. 7 to 11 illustrate diagrams showing a substrate processing method according to the flow chart of FIG. 6 according to some example embodiments.

Referring to FIGS. 6 and 7, the substrate placement operation S1 may include placing a substrate WF on the stage 7, or in other words, the stage 7 may receive a substrate WF. As the top surface 7*u* of the stage 7 is inclined, the substrate WF disposed on the stage 7 may also be in an inclined state.

Figure 8:
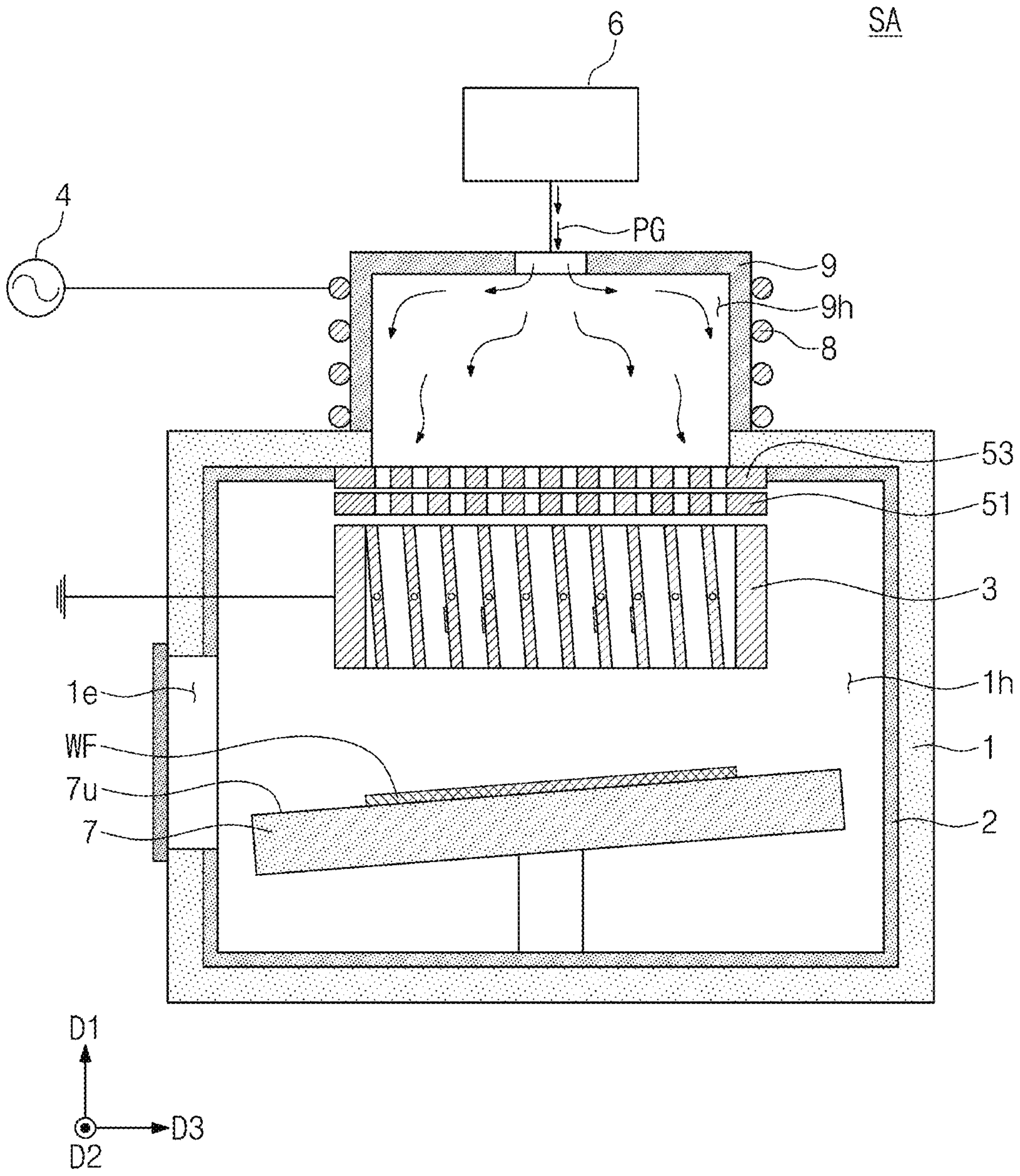

Referring to FIG. 8, a process gas PG may be argon (Ar) gas and may be supplied to the plasma chamber 9 by the gas supply 6, but is not limited thereto. For example, the process gas PG supplied from the gas supply 6 may be introduced into the plasma space 9*h*.

Figure 9:
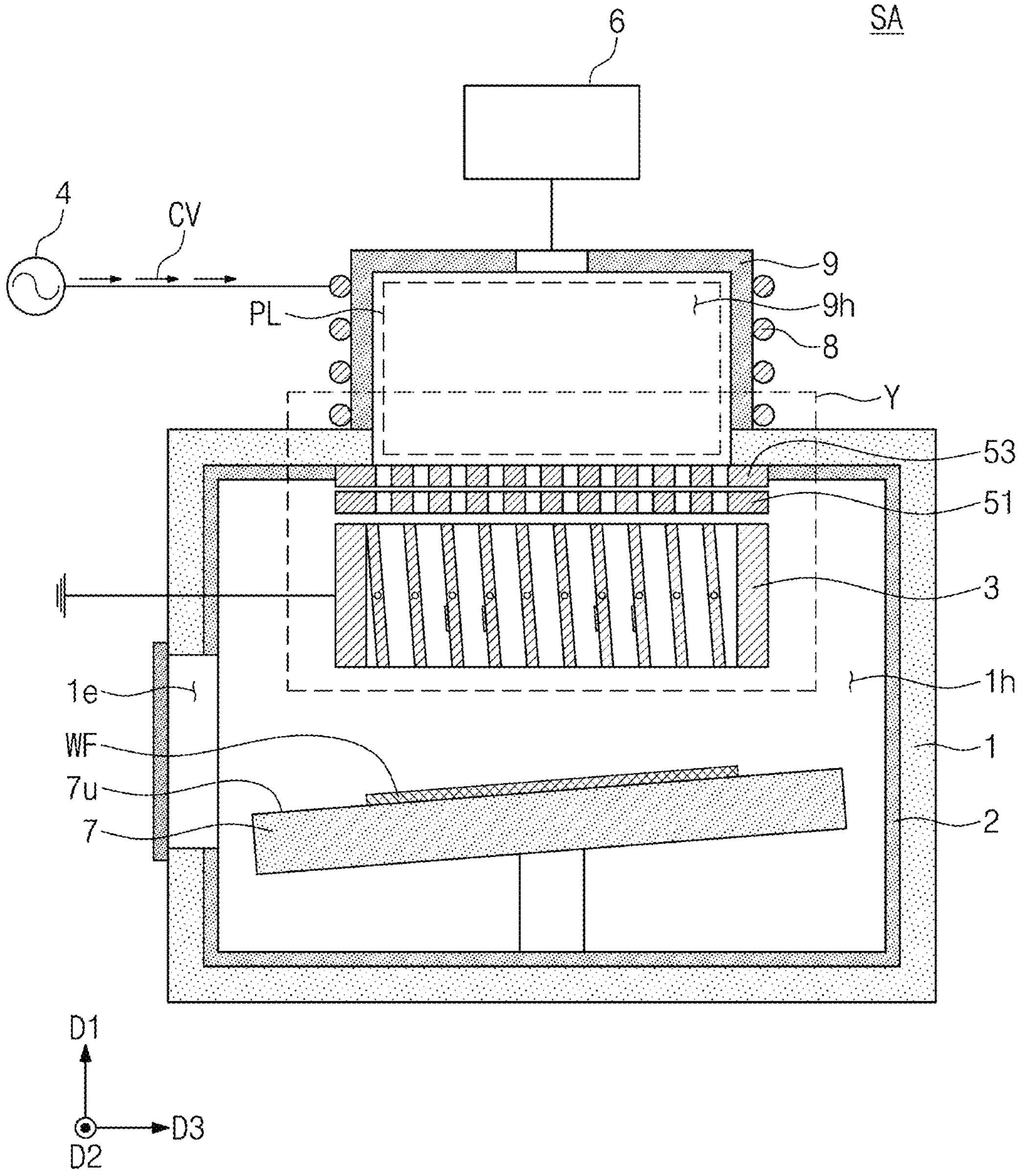

Referring to FIGS. 6 and 9, the RF power supply operation S21 may include the RF power source 4 applying, supplying, and/or transmitting a RF power waveform CV to the RF coil 8. Thus, at least a portion of the process gas (see, e.g., PG of FIG. 8) in the plasma space 9*h* may be converted into plasma PL using the RF waveform CV.

Figure 10:
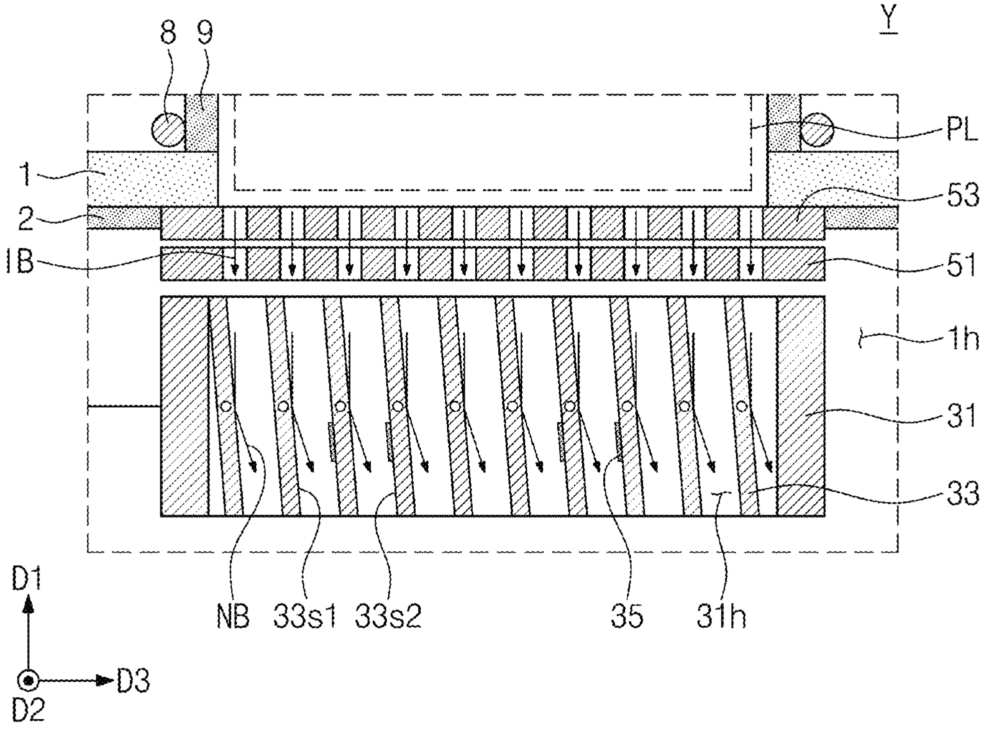

Referring to FIGS. 6 and 10, the first voltage apply operation S22 may include applying a first voltage to one or both of the first grid 51 and the second grid 53 to extract an ion beam IB from the plasma PL. The first voltage may be a direct-current (DC) voltage supplied by a DC power source (not shown) and/or a RF voltage (e.g., a alternating current voltage with a frequency in the RF range) supplied by the RF coil 8, but the example embodiments of the present inventive concepts are not limited thereto. The ion beam IB may penetrate the second grid 53 and the first grid 51 to be incident on the ion beam reflector 3. The ion beam IB incident on the ion beam reflector 3 may collide with the at least one reflection plate 33. For example, the ion beam IB may collide with the first lateral surface 33*s*1 of the reflection plate 33, thereby being reflected from the reflection plate 33, but is not limited thereto. The ion beam IB that collides with the first lateral surface 33*s*1 may be neutralized and may convert into a neutral beam NB. The neutral beam NB reflected by the first lateral surface 33*s*1 may travel to the substrate WF onto the stage (see, e.g., stage 7 of FIG. 9). Thus, the substrate WF may be etched with the neutral beam NB. In this procedure, the temperature of the reflection plate 33 may be increased due to the neutral beam NB.

Figure 11:
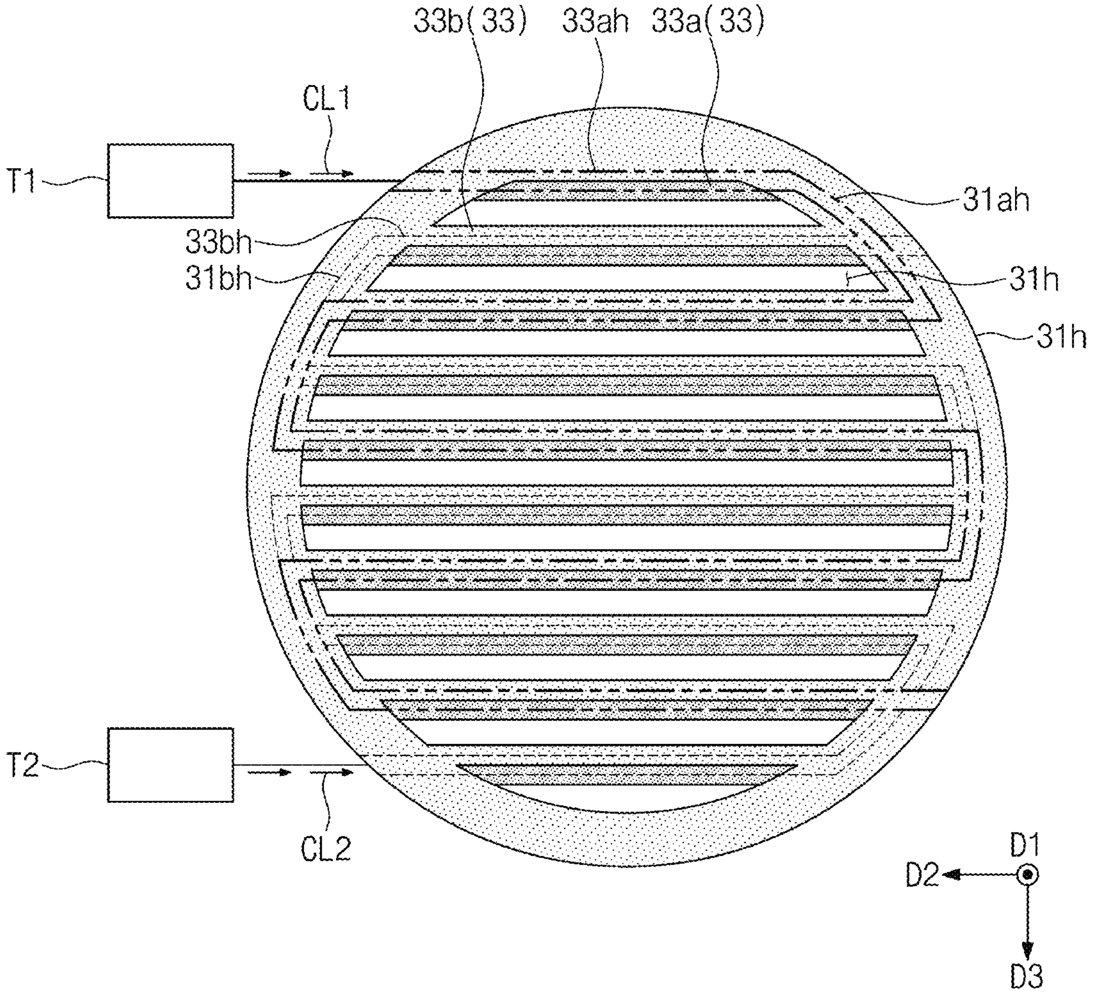

Referring to FIGS. 6 and 11, in operation S23, the first cooling fluid supply T1 may supply the first cooling passage 33*ah* with a first cooling fluid CL1 and/or the second cooling fluid supply T2 may supply the second cooling passage 33*bh* with a second cooling fluid CL2, etc. The first cooling fluid CL1 may be the same as and/or substantially similar to the second cooling fluid CL2, but the example embodiments are not limited thereto. For example, the first cooling fluid CL1 may include liquefied nitrogen, but the example embodiments of the present inventive concepts are not limited thereto, and for example, the first cooling fluid CL1 and/or the second cooling fluid CL2 may be different fluids. The cooling fluid may decrease the temperature of the reflection plate 33. For example, it may be possible to cool the reflection plate 33 that is heated to a high temperature by the ion beam IB with the cooling fluid.

In operation S24, the temperature sensor (see, e.g., temperature sensor 35 of FIG. 10) may measure the temperature of the reflection plate 33 and the temperature measured by the temperature sensor 35 may be compared to a desired temperature threshold for the reflection plate 33. Based on the measured temperature of the temperature sensor 35 and the desired temperature threshold, the method may return to operation S23 and the first cooling fluid supply T1 and/or second cooling fluid supply T2 may adjust the supply of the first cooling fluid CL1 to the first cooling passage 33*ah* and/or adjust the supply of the second cooling fluid CL2 to the second cooling passage 33*bh*, respectively. In other words, the first cooling fluid supply T1 and/or the second cooling fluid supply T2 may adjust the flow rate of their respective cooling fluids based on the feedback (e.g., the measured temperature of the reflection plate 33) from the temperature sensor 33. For example, when a temperature of the reflection plate 33 is equal to or less than a critical temperature of the reflection plate 33 (e.g., the desired temperature threshold), the supply of cooling fluid to the reflection plate 33 by the first cooling fluid supply T1 and/or the second cooling fluid supply T2 may be interrupted and/or stopped. The critical temperature (e.g., the desired temperature threshold) may be, for example, a boiling temperature of the process gas, e.g., the boiling temperature of argon (Ar), etc., but is not limited thereto. Thus, the temperature of the reflection plate 33 may not be decreased below the boiling temperature of the process gas, e.g., argon (Ar), but the example embodiments are not limited thereto. When the temperature of the reflection plate 33 is higher than the desired first temperature threshold and below or equal to a desired second temperature threshold, the supply of cooling fluid to the reflection plate 33 by the first cooling fluid supply T1 and/or the second cooling fluid supply T2 may be maintained, and in response to the temperature of the reflection plate 33 being higher than the desired second temperature threshold the flow rate of the cooling fluid may be increased to supply more cooling fluid to the reflection plate 33, thereby decreasing the temperature of the reflection plate 33. Accordingly, the ion beam reflector 3 may maintain its temperature within a certain and/or desired temperature range.

According to at least one example embodiment, an ion beam reflector, a substrate processing apparatus including the same, and a substrate processing method using the same a temperature of an ion beam reflector controlled and/or the ion beam reflector may be prevented from being overheated. Thus, the ion beam reflector may be free of damage from high temperatures. Accordingly, even when the ion beam reflector is used for a long time, a substrate may be uniformly etched.

According to at least one example embodiment, an ion beam reflector, a substrate processing apparatus including the same, and a substrate processing method using the same, a temperature sensor may be used to cause the ion beam reflector to maintain its temperature within an appropriate and/or desired temperature range. For example, the temperature of the ion beam reflector may be prevented from being decreased below a boiling point of a process gas. The process gas may thus be decreased and/or prevented from becoming liquefied during the etching process.

According to at least one example embodiment, an ion beam reflector, a substrate processing apparatus including the same, and a substrate processing method using the same, a cooling fluid may be positioned within a reflector, and thus a temperature of the reflector may be directly controlled. A temperature of the reflector with which an ion beam collides may be measured and/or directly measured, and accordingly, accurate temperature control may be performed.

Figure 12:
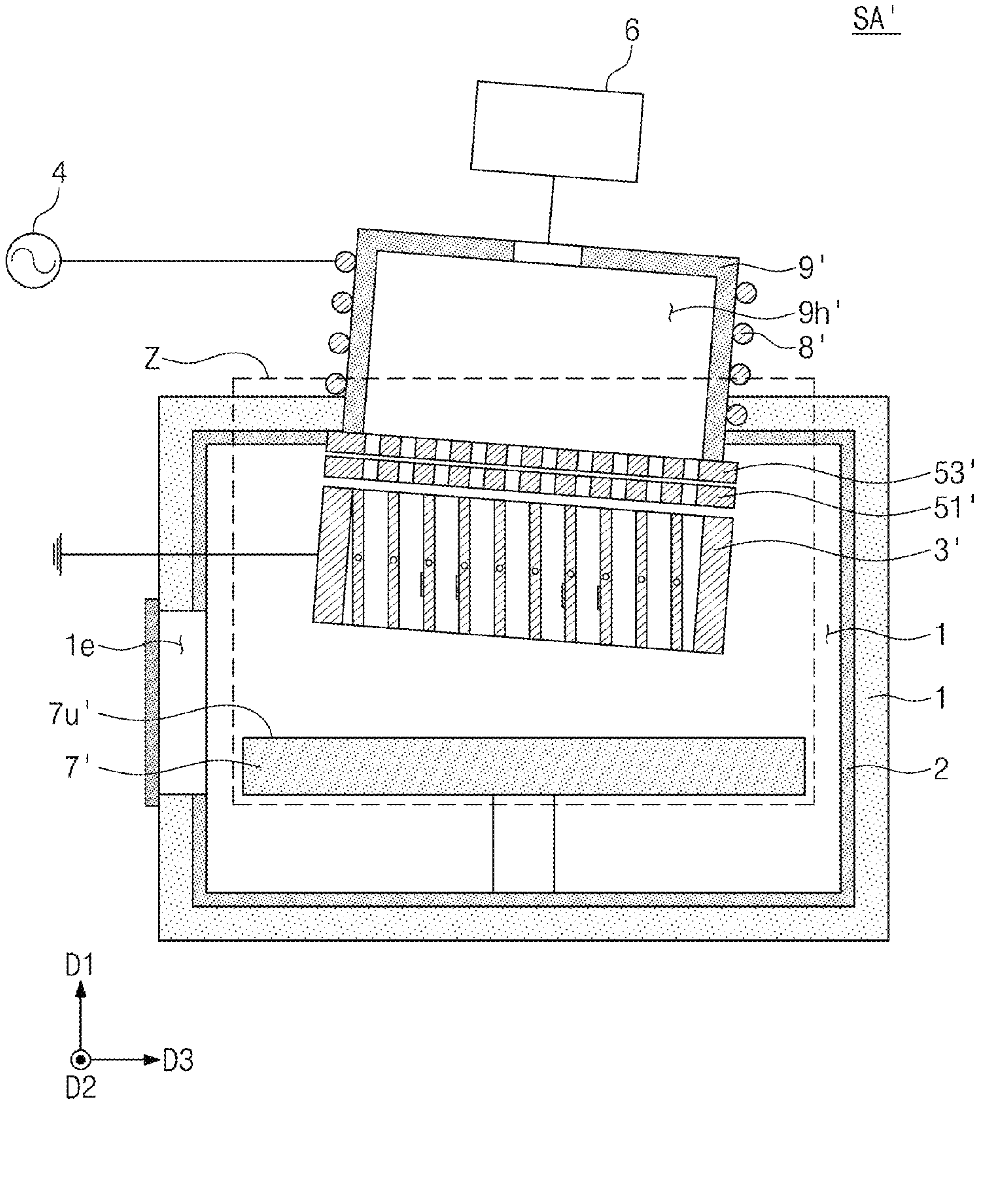
FIG. 12 illustrates a cross-sectional view showing a substrate processing apparatus according to some example embodiments of the present inventive concepts.
Figure 13:
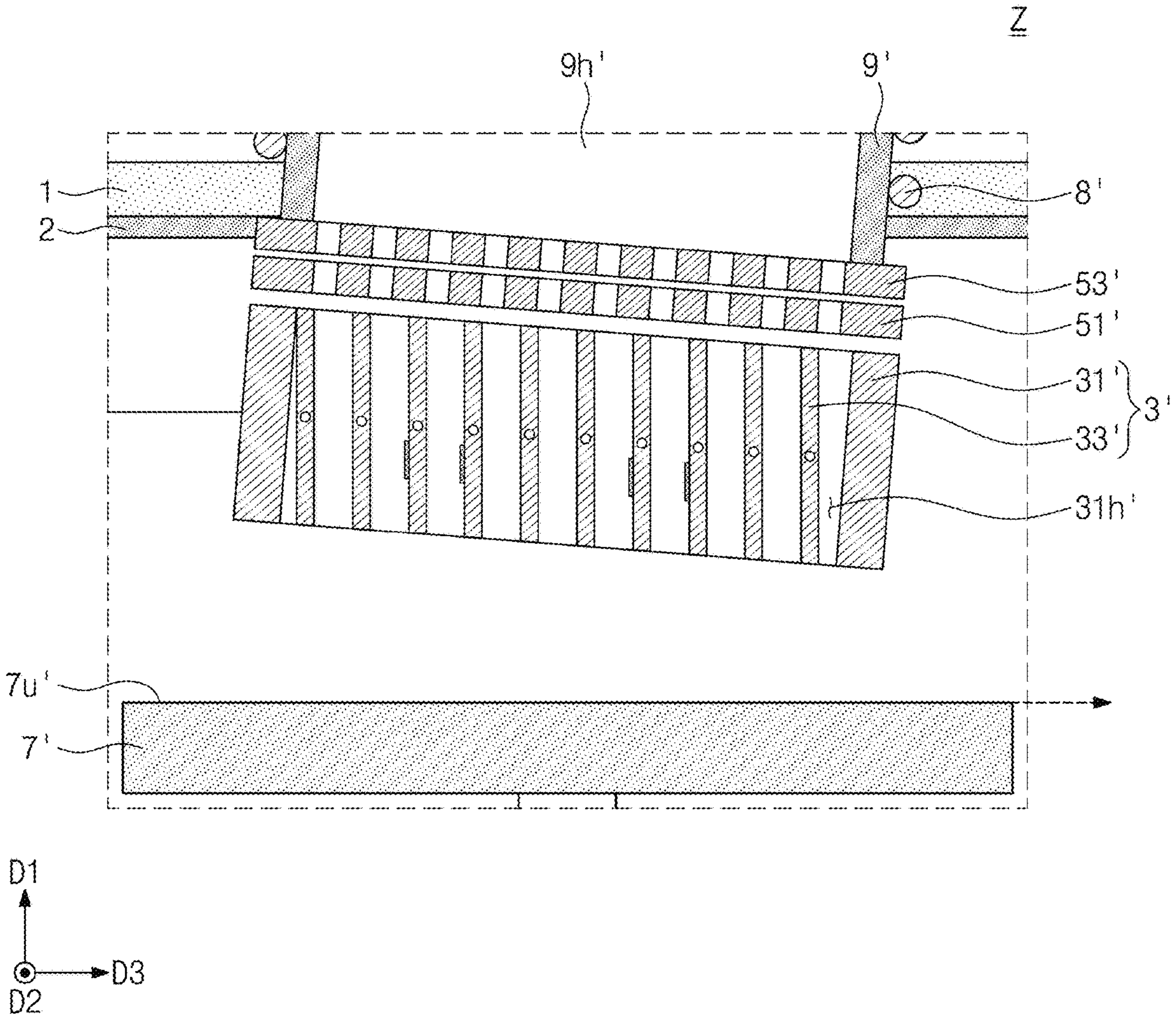
FIG. 13 illustrates an enlarged plan view showing section Z of FIG. 12 according to at least one example embodiment.

FIG. 12 illustrates a cross-sectional view showing a substrate processing apparatus according to some example embodiments of the present inventive concepts. FIG. 13 illustrates an enlarged plan view showing section Z of FIG. 12 according to at least one example embodiment.

The following discussion will omit description of features that are the same as or substantially similar to features discussed with reference to FIGS. 1 to 11.

Referring to FIGS. 12 and 13, a substrate processing apparatus SA' may be provided. The substrate processing apparatus SA' may include a process chamber 1, a plasma chamber 9', a gas supply 6, a radio-frequency (RF) coil 8', a radio-frequency (RF) power source 4, a stage 7', an insulation wall 2, a first grid 51', a second grid 53', and/or an ion beam reflector 3', but is not limited thereto.

A top surface 7*u*' of the stage 7' may be perpendicular to the first direction D1, but is not limited thereto. For example, the top surface 7*u*' of the stage 7' may be parallel to the horizontal direction (e.g., the third direction D3), but is not limited thereto. Thus, a substrate disposed on the stage 7' may also be perpendicular to the first direction D1.

The plasma chamber 9', the RF coil 8', the first grid 51', the second grid 53', and/or the ion beam reflector 3' may be inclined differently than what is shown in FIG. 1. For example, each of the plasma chamber 9', the RF coil 8', the first grid 51', the second grid 53', and the ion beam reflector 3' may be inclined to make an acute angle with the top surface 7*u*' of the stage 7', but are not limited thereto. Thus, even when a substrate disposed on the stage 7' is aligned in the horizontal direction, an etching process may be performed using a neutral beam.

An ion beam reflector, a substrate processing apparatus including the same, and/or a substrate processing method using the same of one or more of the example embodiments of the present inventive concepts, the ion beam reflector may have a reduced heat generation and/or may be prevented from becoming overheated.

An ion beam reflector, a substrate processing apparatus including the same, and/or a substrate processing method using the same of one or more example embodiments of the present inventive concepts, may allow for a reduction and/or prevention of damage of a temperature sensor which measures a temperature of the ion beam reflector.

An ion beam reflector, a substrate processing apparatus including the same, and/or a substrate processing method using the same of one or more example embodiments of the present inventive concepts, may allow for a substrate may be uniformly etched.

An ion beam reflector, a substrate processing apparatus including the same, and/or a substrate processing method using the same of the present inventive concepts, may allow for an increased and/or a long-time use.

Various effects and/or benefits of the present inventive concepts are not limited to the mentioned above, other effects and/or benefits which have not been mentioned above will be clearly understood to those skilled in the art from the following description.

Although various example embodiments of the inventive concepts have been described in connection with the accompanying drawings, it will be understood to those of ordinary skill in the art that various changes and modifications may be made without departing from the technical spirit and essential features of one or more example embodiments of the present inventive concepts. It therefore will be understood that the example embodiments described above are just illustrative but not limitative in all aspects.

What is claimed is:

1. A substrate processing apparatus, comprising:

an ion beam reflector, the ion beam reflector including, a support ring including a neutralization space, the neutralization space extending in a first direction; and a plurality of reflection plates coupled to the support ring, the plurality of reflection plates extending in a second direction across the neutralization space, the second direction intersecting the first direction, the plurality of reflection plates being spaced apart from each other in a third direction which intersects the first direction and the second direction, and each of the plurality of reflection plates including a cooling passage that extends in the second direction.

2. The substrate processing apparatus of claim 1, wherein, for each reflection plate of the plurality of reflection plates:

the cooling passage penetrates through the reflection plate in the second direction;

a first end of the cooling passage is connected to a first side of the support ring; and a second end of the cooling passage is connected to a second side of the support ring.

3. The substrate processing apparatus of claim 2, wherein the plurality of reflection plates include, a plurality of first reflection plates including a plurality of first cooling passages, and a plurality of second reflection plates including a plurality of second cooling passages;

the plurality of first reflection plates and the plurality of second reflection plates are alternately arranged;

the plurality of first cooling passages are connected to each other; and the plurality of second cooling passages are connected to each other.

4. The substrate processing apparatus of claim 3, wherein the support ring includes a first ring passage that extends in a circumferential direction; and the first ring passage connects to at least two of the plurality of first cooling passages.

5. The substrate processing apparatus of claim 3, wherein the plurality of first cooling passages are not connected to the plurality of second cooling passages.

6. The substrate processing apparatus of claim 1, wherein the ion beam reflector further comprises:

a temperature sensor, the temperature sensor connected to at least a portion of at least one of the plurality of reflection plates.

7. The substrate processing apparatus of claim 1, wherein each of the plurality of reflection plates makes an acute angle with respect to the first direction.

8. The substrate processing apparatus of claim 1, wherein the ion beam reflector further comprises:

a temperature sensor, the temperature sensor connected to a lateral surface of at least one of the plurality of reflection plates; and each of the plurality of reflection plates makes an acute angle with the first direction.

9. The substrate processing apparatus of claim 1, wherein each of the plurality of reflection plates includes at least one of a metal, a metal alloy, or any combination thereof.

10. The substrate processing apparatus of claim 1, further comprising: a first grid including a first through hole, the first through hole extending in the first direction; and a second grid on the first grid, the second grid including a second through hole, the second through hole extending in the first direction.

11. The substrate processing apparatus of claim 10, further comprising:

a stage configured to support a substrate, the stage spaced apart in the first direction from the ion beam reflector; and a radio-frequency coil on the second grid.

12. A substrate processing apparatus, comprising:

a first grid including a first through hole, the first through hole extending in a first direction;

a second grid on the first grid, the second grid including a second through hole, the second through hole extending in the first direction; and an ion beam reflector beneath the first grid, the ion beam reflector including, a support ring, the support ring defining a neutralization space, the neutralization space extending in the first direction, a reflection plate that extends in a second direction, the second direction intersecting the first direction, the reflection plate extending along the support ring, the reflection plate inclined with respect to the first direction, the reflection plate including a first lateral surface that faces toward the first grid and a second lateral surface opposite to the first lateral surface, and a temperature sensor connected to the second lateral surface.

13. The substrate processing apparatus of claim 12, wherein the reflection plate is inclined in a range of 1° to 9° with respect to the first direction.

14. The substrate processing apparatus of claim 12, wherein the reflection plate includes a cooling passage that penetrates through the reflection plate in the second direction.

15. The substrate processing apparatus of claim 12, wherein the reflection plate includes, a first reflection plate, and a second reflection plate, the second reflection plate spaced apart in a third direction from the first reflection plate, the third direction intersecting each of the first direction and the second direction;

the first reflection plate includes a first cooling passage that extends in the second direction; and the second reflection plate includes a second cooling passage that extends in the second direction.

16. The substrate processing apparatus of claim 15, further comprising:

a first cooling fluid supply configured to supply the first cooling passage with a first cooling fluid;

a second cooling fluid supply configured to supply the second cooling passage with a second cooling fluid; and the first cooling passage and the second cooling passage are not connected to each other.

17. The substrate processing apparatus of claim 16, wherein a first connection position where the first cooling fluid supply and the first cooling passage are connected is spaced apart in the third direction from a second connection position where the second cooling fluid supply and the second cooling passage are connected.

18. The substrate processing apparatus of claim 15, wherein the first reflection plate is a plurality of first reflection plates;

the second reflection plate is a plurality of second reflection plates; and the plurality of first reflection plates and the plurality of second reflection plates alternate.

19. The substrate processing apparatus of claim 12, further comprising:

a stage configured to support a substrate, the stage spaced apart in the first direction from the ion beam reflector; and a radio-frequency coil on the second grid.

20. The substrate processing apparatus of claim 12, further comprising:

a process chamber defining a process space; and an insulation wall contacting an inner surface of the process chamber.

* * * * *